US005507029A

United States Patent [19]
Granato et al.

[11] Patent Number: 5,507,029
[45] Date of Patent: Apr. 9, 1996

[54] METHOD FOR MINIMIZING THE TIME SKEW OF ELECTRICAL SIGNALS IN VERY LARGE SCALE INTEGRATED CIRCUITS

[75] Inventors: Michael A. Granato, Essex Junction, Vt.; Gregory F. Miceli, Poughkeepsie, N.Y.; Jerome R. Relis, Monsey, N.Y.; Craig R. Selinger, Spring Valley, N.Y.; Vernon L. Watts, Poughkeepsie, N.Y.

[73] Assignee: International Business Machines Corporation, Armonk, N.Y.

[21] Appl. No.: 371,329

[22] Filed: Jan. 11, 1995

[51] Int. Cl.$^6$ ................................................. G06F 15/60
[52] U.S. Cl. .......................... 395/500; 364/488; 364/489; 364/490
[58] Field of Search ..................... 364/488, 489, 364/490, 491; 327/293, 152, 141, 153, 292, 297, 392, 393; 395/550, 500

[56] References Cited

U.S. PATENT DOCUMENTS

| | | | |
|---|---|---|---|
| 4,564,943 | 1/1986 | Collins et al. | 371/28 |
| 4,754,164 | 6/1988 | Flora et al. | 307/269 |
| 4,755,704 | 7/1988 | Flora et al. | 307/269 |
| 4,868,514 | 9/1989 | Azevedo et al. | 327/159 |
| 4,926,066 | 5/1990 | Maini et al. | 307/303.1 |
| 5,043,596 | 8/1991 | Masuda et al. | 327/297 |
| 5,077,676 | 12/1991 | Johnson et al. | 364/489 |
| 5,164,619 | 11/1992 | Luebs | 307/480 |
| 5,235,521 | 8/1993 | Johnson et al. | 364/489 |
| 5,258,660 | 11/1993 | Nelson et al. | 307/269 |

OTHER PUBLICATIONS

Gray et al., "Timing Constraints for Wave–Pipelined Systems", IEEE 1994, pp. 987–1004.
Li et al., "Statistic Analysis of Timing Rules for High–Speed Synchronous Interconnects", IEEE 1992, pp. 37–40.
Zhang et al., "Synchronization of Wave–Pipelined Circuit", IEEE 1994, pp. 164–167.

*Primary Examiner*—Kevin J. Teska
*Assistant Examiner*—Tan Q. Nguyen
*Attorney, Agent, or Firm*—H. Daniel Schnurmann

[57] ABSTRACT

A method for minimizing the time skew between signals traveling through various multi-cycle path nets linking one or several VLSI packages that includes a plurality of IC chips interconnected to each other. The method includes equalizing differences between the early and the late mode slack for each of the multi-cycle nets to decrease the joint probability of failure; maximizing the time balance between the early and the late mode slack; balancing over all the nets the difference between the early and the late mode slack, minimizing in the process statistical variations within the mode slack pair; and compensating for asymmetries between rising and falling switching times using the mode slack pair. The method allows multi-cycle path nets have their transmission line length confined between a maximum and a minimum length, which in turn minimizes the skew between signals in each of the nets, decreases cycle time and improves the overall performance of the system.

16 Claims, 4 Drawing Sheets

METHOD FOR MINIMIZING THE TIME SKEW OF ELECTRICAL SIGNALS IN VERY LARGE SCALE INTEGRATED CIRCUITS

FIELD OF THE INVENTION

This invention relates generally to the design of Very Large Scale (VLSI) Integrated Circuits, and more particularly, to a method for minimizing the skew between signals traveling through various nets within one or several VLSI packages.

BACKGROUND OF THE INVENTION

Current day data processing systems are designed to maximize speed and optimize performance. A commonly used technique to enhance performance is to increase, within the bounds of technology, the clocking frequency of the system which, in turn, reduces cycle time. However, as the cycle time is shortened, less signal skew can be tolerated since, oftentimes, bits transmitted over busses and the like may be lost or suffer statistical degradation.

Cycle time of high performance data processing systems have been significantly reduced over time, a trend which has been accelerated by the ubiquitous use of multi-cycle path nets at the board and system level. (Multi-cycle path refers to a combinatorial logic path with a delay that exceeds the operating cycle time of the synchronous clocked logic it interfaces).

Multi-cycle paths did not exist some 15 or 20 years ago, when cycle times were longer due to inherently slower circuit delays. Eventually, circuit delay improvements far outpaced those in packaging delay. Indeed, multi-cycle paths today are most evident between packaging levels. They mostly comprise cable busses between boards, and on-board busses between multi-chip modules or cards. As cycle times continue their downward trend and chips increase in density, the composition of a multi-cycle path will eventually shift towards chip-to-chip, and ultimately towards long distances on-chip due to wire delays. These wire delays have less opportunity to improve at the same pace as circuit delays, at which time they will be able to affect cycle time reduction.

Cable net limitations presently determine what constitutes an acceptable range of cycle times which, in turn, define the characteristics of the cable interfaces. Multi-cycle cable interfaces tend to operate over a narrow range of cycle times as a result of signal skewing, a direct consequence of the same clock signals servicing simultaneously very fast and very slow chips. Skews may also be caused by clock variations germane to any clocking signal generator and by variations in physical parameters, such as wire length and via capacitance. Typically, when the limit of a range is reached, boards and other such components having different electrical characteristics must be redesigned or buffered or, alternatively, cables must be substituted to ensure the proper arrival of the clocking signals at the appropriate receiver at the end of a cable net. Practitioners of the art will fully appreciate that proper arrival is not necessarily restricted to signals arriving too late within a cycle but also include signals arriving too early, i.e., prior to a time window opening. The quantification of early and late arrivals will henceforth be referred to as early mode slack and late mode slack, respectively, in contradistinction to the desired average mode slack.

Skewing of signals is also caused in part by the asymmetric nature of a signal, wherein the rise and fall times characteristics differ from each other. This asymmetry reflects itself in the different coefficients used in delay equations which are instrumental in determining the exact switching time of a circuit. The non-symmetrical nature of a rising and a falling pulse affects the early and late mode slacks and plays an important role in timing optimization. It is, therefore, insufficient to just de-skew signals unless a methodology is found to account for the non-symmetrical characteristics of the signals.

Whereas clock skews affect all aspects of hardware design, they are most damaging when they are found in clocking systems. A need exists, though, for handling non-clock nets, particularly, since no correlation exists between clock and non-clock skew minimization. Unlike clock skews which are minimized by modifying appropriate system parameters, bus skew minimization requires more complex handling and solutions.

The design of interfaces between various levels of packaging, namely, between various chips on a module, or modules on a card, etc., and their interconnections, such as wires, cables and the like, have become more critical as machine cycles have shrunk. This is of particular relevance when one considers that multiple cycles of data coexist on these multi-cycle path interconnections while other data bits travel over some other interconnections within the net, forcing the designer to account for these delays in the overall computation of an optimum system operating cycle. For instance, an "n" cycle interface design requires that the minimum delay for the path to be "n-1" cycles, and the maximum delay to be "n" cycles. As "n" increases for the interface, the range of the operable cycle time is reduced.

It is known that busses exist to interface between functional islands. Cycle time can be minimized by setting it according to the shorter path delays between islands. Larger delays associated with communication between one island and the next need to be handled by the aforementioned multi-cycle paths in a synchronous design. Once it is determined that a path does not meet cycle time objectives, it is then designed to ensure that data will be captured by a subsequent synchronous clock pulse. By way of example, if a particular path has a nominal delay of 1.5×cycle time, to guarantee capture of the data, one would ensure that the signal will always arrive after one cycle time, and also before two cycle times. Data is placed on the bus and read every cycle, but it takes two cycles for the data to get across. Thus, two cycles worth of data coexist on the bus at any one time (oftentimes, referred to as "storing" data on the bus).

As the cycle time shrinks, the difference between early and late arrivals for the plurality of nets in the multi-cycle cable becomes an ever increasing percentage of the overall cycle time. It therefore reduces the amount wherein the cycle time can vary without experiencing a failure to capture part of the data. Furthermore, since the low operating cycle time variance is inversely proportional to "n", and the high cycle time variation is inversely proportional to "n-1", as "n" increases, the cycle time range correspondingly decreases.

Several solutions for de-skewing and skew compensation have been described. By way of example, Flora et al., in U.S. Pat. Nos. 4,754,164 and 4,755,704 describe a method and an apparatus for automatically de-skewing the clock in a multi-layer circuit board comprised of a plurality of IC chips. On-chip circuitry requiring an accurate delay is provided by means of a strip transmission line formed on the conductive planes of the circuit board.

Another type of solution which has been employed to minimize skew is described by Johnson et al., in U.S. Pat. Nos. 5,077,676 and 5,235,521. of common assignee, wherein the time delay in all clock trees is equalized by equalizing the delay through each level of the tree. This process is achieved by adjusting the capacitance of terminators in each net at each level or by adjusting the power of each driver at each level.

In yet another type of solution described in U.S. Pat. No. 5,258,660 to Nelson et al., the clock delay is precisely adjusted to reduce clock skew by introducing electronically programmable skew adjustment means that incorporates capacitive delay elements that provide multiple signal paths of various delays. These elements are controlled by delay selection circuitry that performs the appropriate delay selection.

All the solutions previously described have the common characteristic of using hardware means for de-skewing clock signals. Practitioners of the art will fully appreciate that hardware solutions suffer a major drawback in that they introduce additional cost, use valuable real estate on the IC chip or package and, oftentimes, require manual adjustments, all of which are expensive and time consuming.

Moreover, present techniques are inadequate in that they do not generally take into account that they require arrival times that differ from bus to bus and from cable to cable. They also fail statistically to maximize the range of acceptable machine cycles for a given cable, board, etc. The absence of multi-cycle path support and the single cycle path support shortcomings dictate the need for a slack based algorithm that will, at the very least, provide a balance between slacks that optimizes the cycle times for designs that encompass multi-cycle paths.

OBJECTS OF THE INVENTION

Accordingly, it is an object of the present invention to provide a method for de-skewing signals for any selected group of nets across multiple packages (cards, boards, frames, etc.), each of which is comprised of IC chips.

It is another object to minimize the skew for nets having multi-cycle paths, wherein the number of cycles per path varies.

It is yet another object to automatically compensate for variations created by the asymmetric rise and fall time of the signals to be de-skewed.

It is a more particular object to minimize skew so as to maximize the range of cycle times over which hardware operates.

It is a further object to minimize statistical variations of delay across the machine time domain.

It is yet another object to minimize skew for any selected group of nets encompassing both early and late timing boundaries.

SUMMARY OF THE INVENTION

The foregoing problems are overcome and other advantages are provided by a method for minimizing the skew between a signal in one net within an IC package having a plurality of IC chips interconnected by multi-cycle path nets, wherein each multi-cycle path net contains signals to be de-skewed, and a signal in a second net, the method comprising the steps of: a) performing timing analysis to determine for each of the nets an early and a late mode slack and an estimated wire length; b) synchronizing the signals within each of the groups based on the early and a late mode slack to minimize the occurrence of statistical failures; c) calculating for each of the nets an exact wire length target; d) rerunning the timing analysis to produce a new value for the early and late mode slack based on the exact wire length target; and e) transforming the new early and late mode slack into a minimum and a maximum wire length target, whereby by having signals in one of the nets to be de-skewed with respect to signals in a second of the nets, an improved circuit design and system cycle time is obtained.

While the most likely application for the present invention is in a computer system, those skilled in the art will recognize that the invention is applicable to a variety of systems and to any type of signals when it is necessary to precisely control its timing.

The foregoing aspects and other features which characterize the invention are pointed out with particularity in the claims annexed hereto and forming a part thereof. However, for a better understanding of the invention, its advantages, and the objects obtained by its use, reference should be made to the drawings which form a further part hereof, and to the accompanying descriptive matter in which there is illustrated and described a preferred embodiment of the invention.

DETAILED DESCRIPTION OF THE INVENTION

Figure 1:
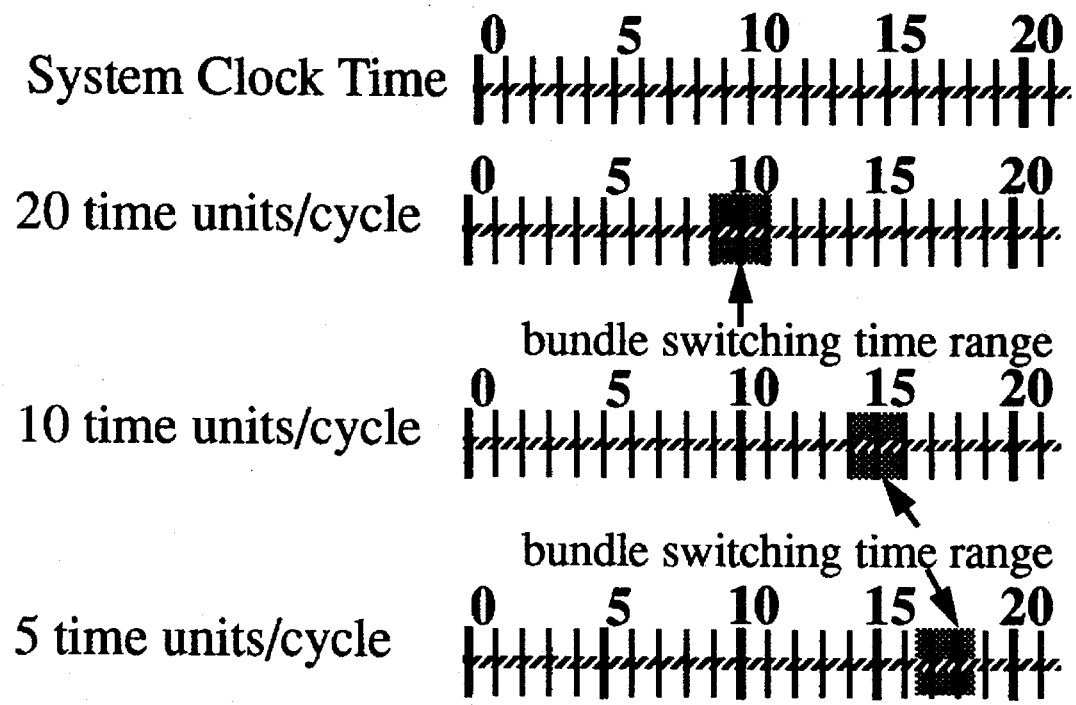
FIG. 1 is a schematic diagram showing how path skew affects cycle time range as the skew is held constant, while the cycle time is reduced.

Referring to FIG. 1, it is shown how by increasing the speed of a system clock (which decreases the cycle time), the need for de-skewing signals within a bundle of nets becomes increasingly important.

Considering the presence of an interface having a 2 nsec. skew, it is assumed that the time of arrival of a signal is centered around the desired cycle for each of the three following cases: a 1-cycle path, a 2-cycle path and a 4-cycle path. The hatched section of the cycle time is a window representing the arrival of data.

In the case of a 1-cycle path, (i.e., 20 time units/cycle) the operating cycle time limits are:

Low=20−(20−11)/1=11 nsec.

High=20+(9−0)/0=infinity

In the above example, the valid system cycle time operating range is greater than 11 nsec. If it were less than 11 nsec., the latest signal in the bundle would not arrive in a timely manner. Moreover, the cycle time can be slowed to an infinite maximum without losing the signal, in view of the single cycle time clock used herein.

For the 2-cycle path (i.e., 10 time units/cycle)

Low=10−(20−16)/2=8 nsec.

High=10+(14−10)/1=14 nsec.

In this second example, the cycle time of the system is confined within an operating ranging between 8 and 14 time units, i.e., extending over 6 time units. It is evident that a 6 unit window is substantially more restrictive than the unlimited infinite window described in the first example.

For the 4-cycle path (i.e., 5 time units/cycle):

Low=5−(20−18.5)/4=4.625 nsec.

High=5+(16.5−15)/3=5.5 nsec.

In this last example of 5 time units per cycle, it is shown that the valid cycle time operating range is confined to a window between 4.625 and 5.5 time units. This window spanning over 0.875 time units exemplifies the limitations experienced in the system design caused by signal skew within the bundle.

Figure 2:
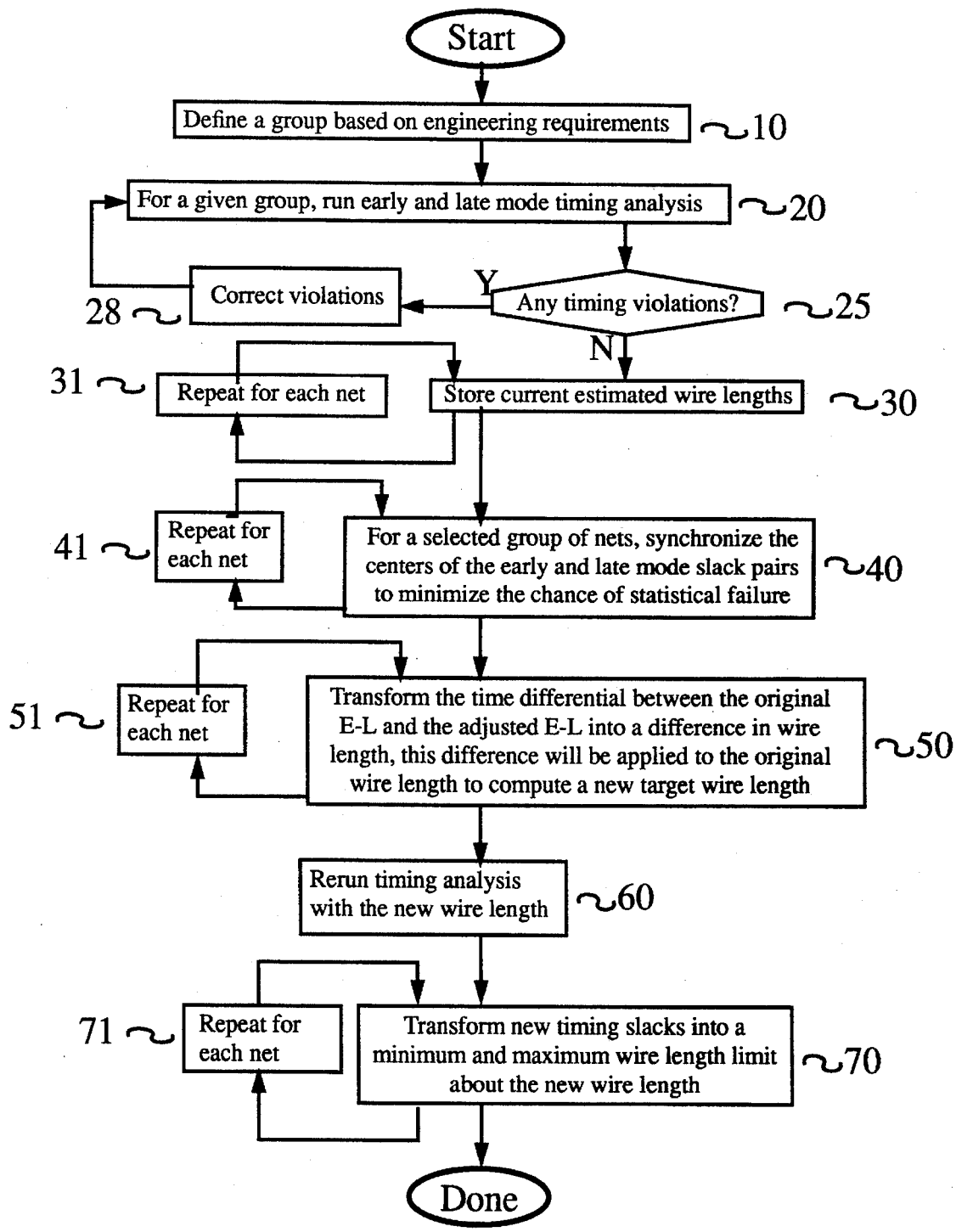
FIG. 2 is a flow chart illustrating the various steps for minimizing time skew in multi-cycle cable nets, in accordance with the present invention.

Referring to FIG. 2, a flow chart is shown which illustrates the steps for minimizing time skew in multi-cycle cable nets, in accordance with the present invention.

For better comprehension of how the skew between signals is minimized, the most commonly terms used hereinafter will be defined:

Definitions

An early mode slack is the amount by which a signal arrives later than the earliest acceptable time of arrival.

$E(i,1_i)$ represents the early mode slack for a net i (e.g., 2 nsec) when the wire length of net is $1_i$.

$E\_delay(i,1_i)$ is the minimum of the nominal rising delay and nominal falling delay for net i when the wire length of net i is $1_i$. If the length of net i increases, the early mode slack also increases, provided that all other parameters, such as clock cycle time, remain unchanged.

Late mode slack is the amount by which a signal arrives prior to the latest acceptable time of arrival.

$L\_delay(i,1_i)$ is the maximum of the nominal rising delay and nominal falling delay for net i when the wire length of net i is $1_i$.

$L(i,1_i)$ represents the late mode slack for net i (e.g., 1 nsec) when the wire length of net i is $1_i$. If the length of net i increases, the late mode slack decreases, provided that all other parameters, such as clock cycle time, remain unchanged.

$E(i,1_i)–L(i,1_i)$ is the difference between the early mode and late mode slack for net i when the wire length of net i is $1_i$. Likewise, as the length of net i increases, the difference $E(i,1_i)–L(i,1_i)$ also increases, since when i gets larger, $E(i,1_i)$ increases while $L(i,1_i)$ decreases.

Tau $(\tau)$ (i) is the time of flight per unit length of a signal in net i. Usually $\tau$ varies by a few percentage points for a given technology (e.g., between 7.8 and 8.1 nsec.). Historically, at the package level only a linear dependence of wire length on $\tau$ is used. Therefore, for a given $\Delta$ delay on net i, a $\Delta$ wire length can be determined by dividing the $\Delta$ delay over $\tau$.

Assuming $\tau$ Max(i) to be the maximum of the rising and falling $\tau$'s associated with net i, the variation between rising and falling $\tau$'s for a given net i is even smaller than the variation described above for all $\tau$'s.

Skew tolerance for net i is determined by how much $E(i,1_i)–L(i,1_i)$ is allowed to vary over all the nets forming the group. This tolerance is specified by the user, and is based on how tightly de-skewing is desired.

Steps Required for De-skewing

Referring to FIG. 2, the process described herein is initiated by defining a group, e.g., the nets that comprise a cable, the nets that interconnect groups of memory cards and a CPU module on the board, or all the nets that connect an on-chip cache array and the on-chip CPU, etc. A first group, defined in accordance with an accepted engineering specification that is based on some engineering requirement is selected (block 10). An early and a late mode timing analysis is performed (block 20). If any timing violations are found (block 25), block 28 is activated, wherein these timing violations are corrected. Otherwise, the current estimated wire length for that net is stored (block 30). For a selected group, the $E(i,1_i)–L(i,1_i)$ of the early/late slack pairs are synchronized so as to minimize the chance of a statistical failure (block 40). This allows for the balancing of the early/late slack modes in order to achieve a maximum cycle time. When the system operates under system conditions, a cycle time is inputted by the designer from a predetermined bench mark cycle time both in the positive and in the negative directions. Accordingly, the statistical chances of a timing failure are minimized over a wide range of cycle times.

Typically, a machine cycle time is gated by the highest level of packaging. In the previous example, this package is comprised of cables. When initial hardware is built, problems may exist in the chips, modules or boards that form the package, in which case, it may not be possible to run at the targeted cycle time. It becomes then advantageous to slow down the cycle time for running and testing the components until the cycle times limiting problems are resolved. In the absence of the present invention, the operating cycle time would have been limited to an extent where it would not have been possible to slow it down sufficiently to have the lower level packages run without impinging on the cycle time limit dictated by the cables.

The time delta between the original $E(i,1_i)–L(i,1_i)$ and the adjusted $E(i,1_i)–L(i,1_i)$ is then transformed to a new estimated wire length (block 50). The original timing value is now compared with the new ideal timing value and is subsequently translated into a wire length $\Delta$. This wire length $\Delta$, when applied to the original wire length, provides a correct ideal target wire length for each net within the group under consideration.

With the transformation complete, the timing analysis is rerun using the newly obtained wire lengths (block 60). The original timing was based on a target wire lengths that was algorithmically determined and, thus, was only a rough estimate for providing a basis for computing the correct wire limits. Having now computed the ideal wiring length and the minimum and maximum wire length limits that meet the slack balancing criteria, the actual net delays and the timing slacks also require to be recomputed, as well as the new and improved wire lengths. Block 60, therefore, is instrumental in obtaining correct timing results and valid early and late slacks with the new and improved wire lengths.

In the last step, block 70, the newly calculated timing slacks are transformed into a maximum and a minimum wire length target. This process is repeated for each net. In this manner, with a balanced timing limit slack (block 40) and a newly, improved length target (block 50) converted into a maximum and a minimum wire length (block 70), a workable set of bound limits are obtained that ensure that the hardware to be ultimately built is designed to have its early and late mode slacks perfectly synchronized.

Figure 3:
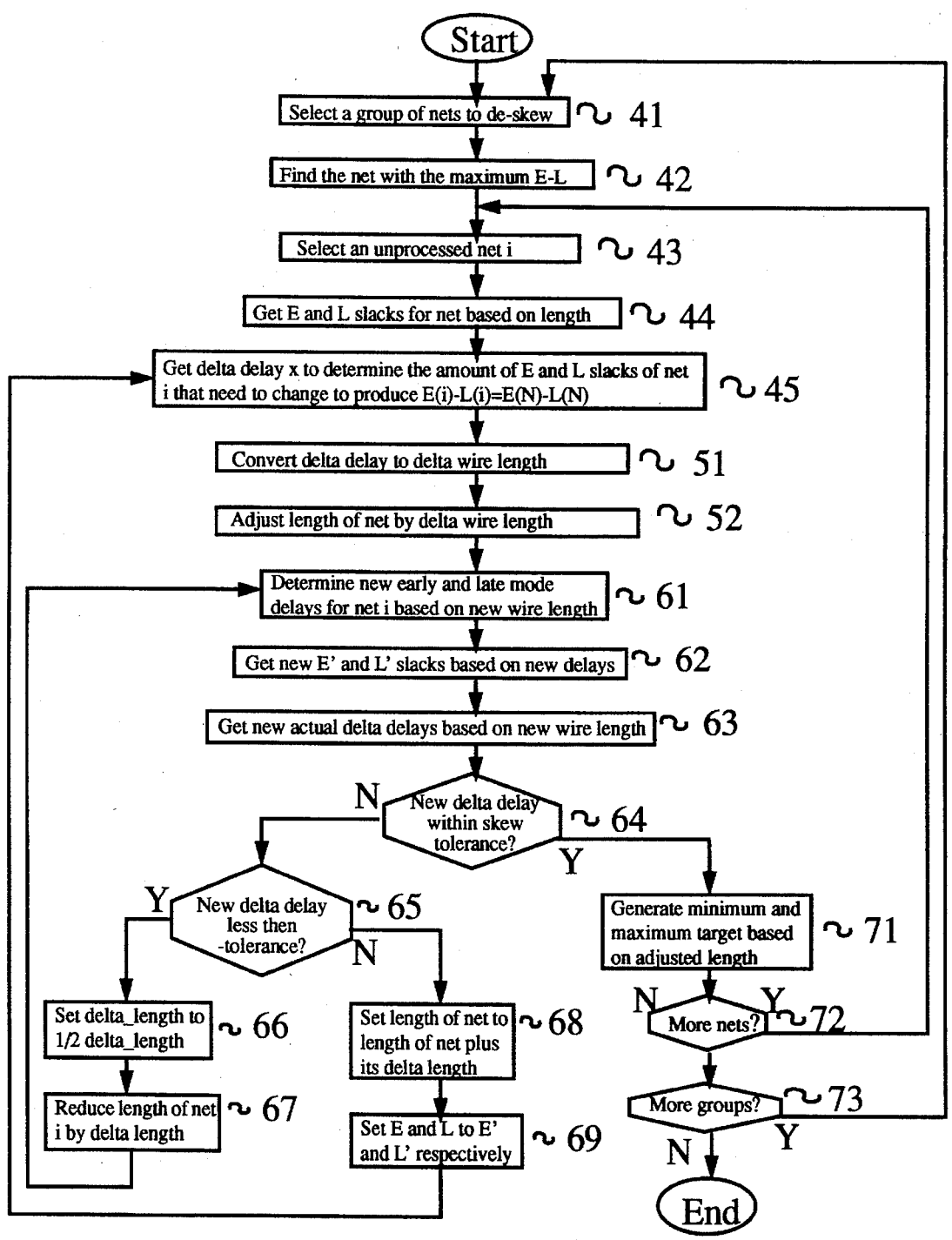
FIG. 3 shows a flow chart describing the de-skewing algorithm that allows minimizing the time skew in multiple-cycle nets, in accordance with the present invention.

Referring now to FIG. 3, it is shown a flow chart describing the de-skewing algorithm that allows minimizing the time skew in multiple-cycle nets, in accordance with the present invention.

Given a selected group of nets that require de-skewing, each net in the group is set to the shortest possible length. If no other information is known, by default, the shortest length is the manhattan distance between the two end points of the net, unless diagonal wiring channels are available in the technology that is used. This results in the smallest $E(i,1_i) - L(i,1_i)$ value possible for net i, since as the length of net i increases $E(i,1_i) - L(i,1_i)$, correspondingly, also increases. The algorithm proceeds by finding a net i such that $E(i,1_i) - L(i,1_i)$ is maximized. This net will, henceforth, be referred to as net N and its corresponding maximum $E(N) - L(N)$ (block 42).

Next, for each net i other than net N:

1. It is determined by how much the early and late mode slacks of net i need to change to generate the slack of $E(N)-L(N)$. Thus, $\Delta$ delay(i) between the value E–L of net N and the value E–L of net i, i.e., $((E(N)-L(N))-(E(i,1_i)-L(i,1_i)))/2$, is determined. Since by definition, net N was selected to have the maximum $E(i,1_i)-L(i,1_i)$ value over all nets in the group to be de-skewed, $\Delta$ delay never becomes negative. The divisor 2 reflects that if both early and late mode slack are changed by delta, the difference between the early and late mode slacks will vary by twice that amount (blocks 44–45).

2. A delay(i) is converted into a $\Delta$ length(i) by dividing it over the time of flight $\tau$ Max(i). Dividing by $\tau$ Max gives an accurate measure of how much the wire length has to vary to result in $\Delta$ delay. Next, $1'_i = 1_i + \Delta$ length(i) is set by adjusting the length of net i by the calculated $\Delta$ length to create the proper $\Delta$ delay. Since the A delay(i) is a combination of the mode slack pair, i.e., the early and late mode slacks, the early mode slack is dependent on the minimum of the rising and falling delay (whereas the late mode slack depends on the maximum of the rising and falling delay). Therefore, when the early mode slack is dependent on the rising delay, the late mode slack will be dependent on the falling delay, and vice versa. Thus, both the early and late mode slacks will have different $\tau$ dependencies. Since the $\Delta$ delay is a combination of the early and late modes, taking $\tau$ Max(i) insures that the wire $\Delta$ length has not been overestimated (blocks 51–52).

3. $E\_delay(i,1_i)$ and $L\_delay(i,1_i)$ are determined (these were previously used to calculate $E(i,1_i)$ and $L(i,1_i)$ so that they may now be stored).

4. $E\_delay(i,1'_i)$ and $L\_delay(i,1'_i)$ are calculated, namely, the early and late mode delay corresponding to the new wire length $1'_i$ (block 61).

5. The new early and late mode slacks $E(i,1'_i)$ and $L(i,1'_i)$ are determined by the equations $E(i,1'_i)=E(i,1_i)+ E\_delay(i,1'_i)-E\_delay(i,1_i)$ and $L(i,1'_i)=L(i,1_i)+ L\_delay(i,1'_i)-L\_delay(i,1_i)$. Finding the new slacks in this manner eliminates the need for a complete timing run (block 62).

6. The new $\Delta$ delay, i.e., $((E(N)-L(N))-(E(i,1'_i)-L(i,1'_i)))/2$ is now calculated. If E and L were always dependent on the same $\tau$, and if $\tau$ would depend on length, the new $\Delta$ delay would always be zero. However, since as previously described, there are slight variations on the dependencies of $\tau$ for rising and falling delays, a potential for second order dependencies on the wire length may exist. In this case, the new A delay can be non-zero (block 63).

7. If the new $\Delta$ delay remains within the skew_tolerance, then the minimum and maximum net targets for net i are generated (blocks 64–71). Otherwise:

If the new $\Delta$ delay is less than minus the tolerance (the $\Delta$ delay will normally be positive), $1'_i=1'_i-\Delta$ length/2 (blocks 65–67). A return to step 4 now takes place; otherwise:

$1_i=1'_i$, followed by a return to step 1 (blocks 68–69).

As was previously mentioned, as the number of cycles per path increases, the switching time window narrows. It is at or near the center of the switching window (depending on whether the early and late mode tolerances are symmetric or not), that the switching time is statistically most likely to occur. The tolerances bind that time. The tolerances for the types of large complex systems that normally incorporate multi-cycle paths are generally not symmetrical. Thus, if one focuses on skew minimization on the early or late mode slacks or on the statistically most likely switching time, this will produce a statistical skewing of the early, of the late or of both slacks. By using the $E(i,1_i)-L(i,1_i)$ method disclosed herein, one insures that a balance between the early mode slack and late mode slack exists by focusing on the difference between them. This insures that the switching times have been fully balanced, thereby allowing to produce a de-skewed system with the widest possible range of system cycle times. Widening this range yields a faster overall system since the range of switching times is improved on the faster and slower ends of the cycle time range.

Figure 4:
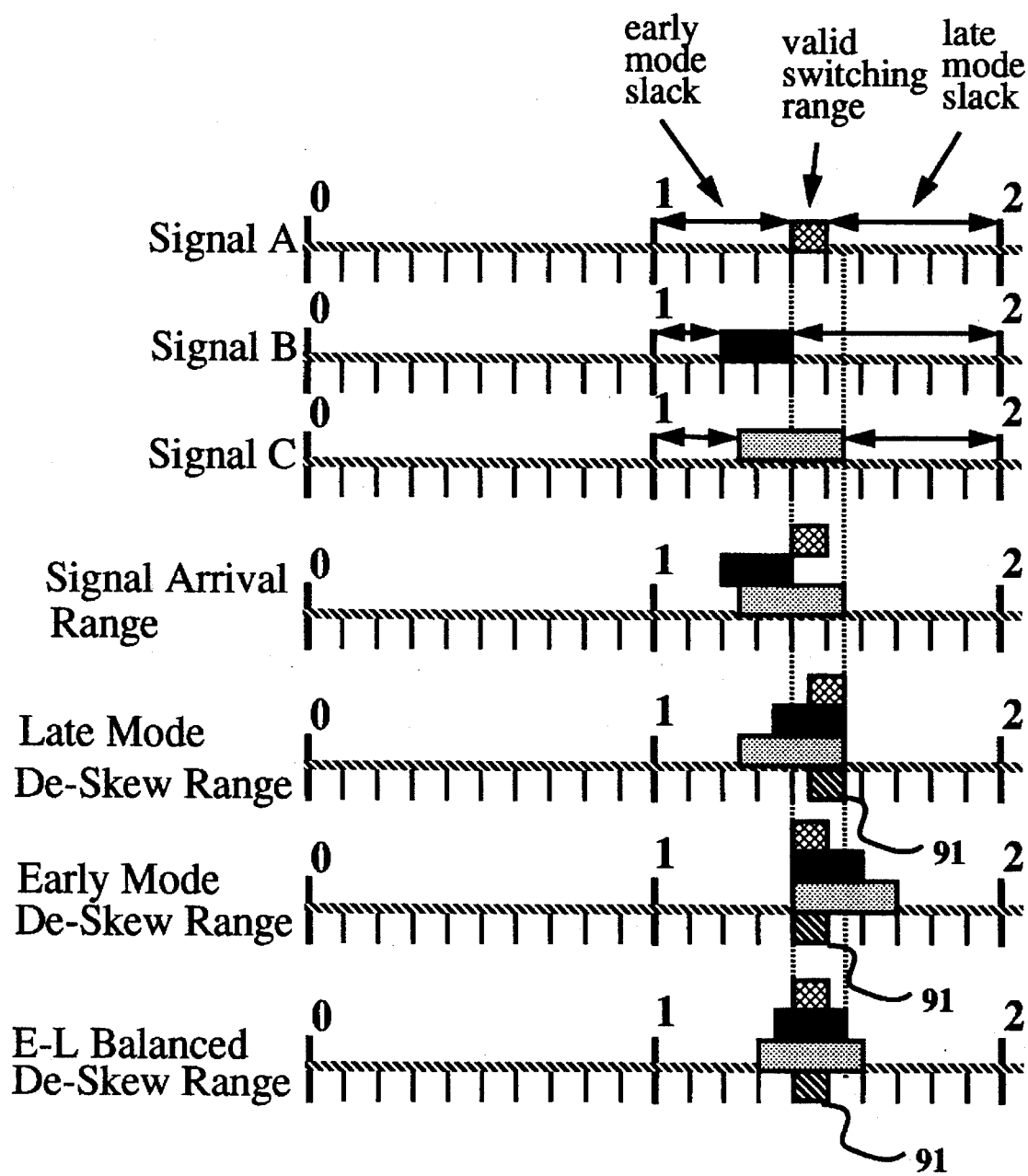
FIG. 4 is a schematic diagram of a double cycle per path showing three signals, each having an early and a late mode slack and their respective early and late mode de-skew.

Referring now to FIG. 4, it is shown an example of a time bar diagram of a double cycle per path, wherein three signals A, B, and C that are skewed with respect to each other are de-skewed using the $E(i,1_i)-L(i,1_i)$ method described herein.

In order to allow for the time graphs to be visible on a single page for easier reading, the text describing these time bars precedes the complete set of time bars.

Although in this example, the case of a double cycle per path was chosen, similar results will occur for larger numbers of cycles per path.

The first time bar describes the system cycle. Three signals, A, B and C, each of which taking two system cycles to switch are displayed. Each signal has an early and late mode slack, as shown. These signals are each described in the context of the next three time bars.

The arrival time range time bar demonstrates that prior to de-skewing, there is no overlay between the switching times for signals A and B. B must be latched before A can be received. Thus, this system cannot possibly run correctly. The overlay demarcation 91 shows the union of legal switching times.

Late mode de-skew time bar—Overlay 91 indicates a valid real switching range based on the intersection of the overlay of the switching times. If one were to de-skew based on late mode, the switching time of signal A is at the edge of the valid switching time for signals B and C. Statistically, there is a much more significant likelihood that C will switch at a time in its valid range that does not overlay with A. Thus, there exists a much higher probability of failure. It is statistically unlikely that the system will switch correctly at the right edge of the valid cycle time range since the likelihood of this event occurring would be the product of the probability of each signal switching at that point, which is a very small. Thus, the real switching range would be limited on the right edge of the range.

Early mode de-skew time bar—If one were to de-skew based on early mode, the switching time for signal A is again at the edge of the valid switching time for signals B and C. Statistically, there is a much more significant probability that C will switch at a time of its valid range that does not overlay with A. Thus, a higher statistical likelihood of failure exists. The same range limitation phenomena discussed above in the late mode example holds true here, but on the left edge of the valid switching range.

$E(i,1_i)-L(i,1_i)$ de-skew time bar—Using the $E(i,1_i)-L(i,1_i)$ method of de-skewing, the switching times is balanced about the signal with the largest $E(i,1_i)-L(i,1_i)$ slack. In this case, the valid switching range is the same as that of the early mode slack solution, and it is better than that of the late mode solution. However, what is particularly important is that all three signals have the highest probability of switching simultaneously at the center of the switching range. Furthermore, this balancing allows for the highest overlay of the most likely (most centered) switching times with the largest statistical probability of success.

While it has been described and illustrated a preferred embodiment of a method for minimizing the skew between signals in an IC, it will be apparent to those skilled in the art that modifications and variations thereon are possible without departing from the scope of the appended claims.

What is claimed is:

1. In a package having a plurality of Integrated Circuit chips interconnected to each other by multi-cycle path nets, said nets containing signals to be de-skewed are being arranged to form a plurality of groups, and each group being successively selected, a method for minimizing within each successively selected group a skew between a signal in one of said nets with respect to a second signal in another of said nets, to achieve an improved circuit design and an enhanced system cycle time said method comprising the steps of:

a) performing timing analysis to determine for each of said nets an early and a late mode slack and an estimated wire length;

b) synchronizing said signals within each of said groups based on said early and said late mode slack to minimize a deviation in slack between said nets, thereby minimizing a likelihood of a statistical failure;

c) calculating for each of said nets an exact wire length target;

d) rerunning said timing analysis to produce a new value for said early and late mode slack based on said exact wire length target; and e) transforming said new early and late mode slack into a minimum and a maximum wire length target, whereby by having signals in one of said nets to be de-skewed with respect to signals in a second of said nets, an improved circuit design and system cycle time is obtained.

2. The method of minimizing skew as recited in claim 1, wherein step a) further comprises the steps of:

estimating a wire length for each of said nets;

correcting violations on said nets to meet system timing requirements; and storing said estimated wire length of each of said nets.

3. The method of minimizing skew as recited in claim 1, wherein step b) further comprises the steps of:

calculating the difference between said early and late mode slack;

finding one of said nets within said group having the largest value for said difference;

time shifting all other said nets to balance against said net having the largest value of said difference between said early and late mode slack; and determining the value of said time shifting.

4. The method of minimizing skew as recited in claim 3, further comprising:

multiplying said time shifting value by a coefficient representing a time of flight of a wire to produce a wire $\Delta$ length;

combining said wire $\Delta$ length with said stored estimated wire length to produce an exact wire length target for each of said nets.

5. The method of minimizing skew as recited in claim 4, wherein said time of flight per unit length of wire is a function of physical and electrical characteristics of said wire and a function of ambient temperature.

6. The method of minimizing skew as recited in claim 4, wherein step e) further comprises the steps of:

multiplying said new early mode slack and said new late mode slack by a coefficient to produce an early and a late mode wire $\Delta$ length, wherein said early mode wire $\Delta$ length is subtracted from said exact wire length target to produce said minimum target wire length, and said late mode wire $\Delta$ length is added to said exact wire length target to produce said maximum target wire length.

7. In a package having a plurality of Integrated Circuit chips interconnected to each other by multi-cycle path nets, said nets containing signals to be de-skewed are being arranged to form a plurality of groups, and each group being successively selected, a method for minimizing within each successively selected group a skew between a signal in one of said nets with respect to a second signal in another of said nets, to achieve an improved circuit design and an enhanced system cycle time said method comprising the steps of:

a) looping through said nets to find one of said nets wherein a difference between an early mode slack E and a late mode slack L for said net is maximized over all said nets;

b) for each of said nets, computing a $\Delta$ delay and a $\Delta$ length;

c) for each of said nets, using current length, determining an E_delay and an L_delay;

d) for each of said nets found in step b), determining a new E_delay and a new L_delay based on said current length augmented by said $\Delta$ length;

e) recomputing for each of said nets a new early mode slack E', a new late mode slack L' and an actual $\Delta$ delay using said new E_delay and said new L_delay, wherein when said actual $\Delta$ delay is confined within a predetermined tolerance, computing wiring targets, said wiring targets being based on said current length augmented by said $\Delta$ length, and when said actual $\Delta$ delay is outside said predetermined tolerance, redefining said $\Delta$ delay to a new value;

f) resetting said current length, and set said E and said L, respectively, to said E' and said L'; and g) repeating step a) for all other said nets within said group, whereby by having in one of said nets to be de-skewed with respect to signals in a second of said nets, an improved circuit design and an improved system cycle time is obtained.

8. The method of minimizing skew as recited in claim 7, wherein said $\Delta$ delay of step b) is one-half the difference between said early mode slack and said late mode slack for said net found in step a) minus the difference between said early mode slack and said late mode slack of said net selected in step b).

9. The method of minimizing skew as recited in claim 7, wherein said $\Delta$ length of step b) equals said $\Delta$ delay divided by a length coefficient multiplier.

10. The method of minimizing skew as recited in claim 7, wherein said E_delay of step c) is the minimum between a nominal rising delay and a nominal falling delay.

11. The method of minimizing skew as recited in claim 7, wherein said L_delay of step c) is the maximum between a nominal rising delay and a nominal falling delay.

12. The method of minimizing skew as recited in claim 7, wherein said current-length of step c) is derived from a real initial wire length based on a manhattan distance.

13. The method of minimizing skew as recited in claim 7, wherein said wiring targets of step c represent a maximum target and a minimum target.

14. In a package having a plurality of IC chips interconnected to each other by multi-cycle path nets, a method of minimizing skew between a signal in one of said nets with respect to a second signal in another of said nets, said method comprising the steps of:

a) equalizing a difference between an early mode slack and a late mode slack for each of said multi-cycle nets to decrease a joint probability of failure;

b) maximizing the time balance between said early mode slack and said late mode slack;

c) balancing over all said nets said difference between said early mode slack and said late mode slack for minimizing statistical variations in said early mode slack and said late mode slack; and d) compensating for asymmetries between rising and falling switching times using said early mode slack and said late mode slack, wherein said multi-cycle path nets have their transmission line length confined between a maximum length and a minimum length, thereby minimizing the skew between signals in each of said nets.

15. The method of claim 1, wherein said package is a card.

16. The method of claim 1, wherein said package is a board.

* * * * *